(12) United States Patent
Hashemi et al.

(10) Patent No.: US 10,134,882 B2
(45) Date of Patent: Nov. 20, 2018

(54) METHOD OF JUNCTION CONTROL FOR LATERAL BIPOLAR JUNCTION TRANSISTOR

(71) Applicant: International Business Machines Corporation, Armonk, NY (US)

(72) Inventors: Pouya Hashemi, White Plains, NY (US); Kam-Leung Lee, New York, NY (US); Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/791,504

(22) Filed: Oct. 24, 2017

(65) Prior Publication Data

US 2018/0083126 A1    Mar. 22, 2018

Related U.S. Application Data

(62) Division of application No. 15/270,144, filed on Sep. 20, 2016, now Pat. No. 9,929,258.

(51) Int. Cl.
*H01L 29/73* (2006.01)
*H01L 21/76* (2006.01)
(Continued)

(52) U.S. Cl.
CPC ...... *H01L 29/7371* (2013.01); *H01L 21/0262* (2013.01); *H01L 21/02532* (2013.01);
(Continued)

(58) Field of Classification Search
CPC ........... H01L 29/7371; H01L 21/76283; H01L 29/1004; H01L 29/0649; H01L 21/308;
(Continued)

(56) References Cited

U.S. PATENT DOCUMENTS 6,043,130 A * 3/2000 Gregory .............. H01L 21/8249
257/E21.345
6,262,472 B1 * 7/2001 Gregory .............. H01L 29/1004
257/592

(Continued)

OTHER PUBLICATIONS

List of IBM Patents or Patent Applications Treated as Related, 2 pgs.

*Primary Examiner* — Didarul Mazumder
(74) *Attorney, Agent, or Firm* — Harrington & Smith; Louis J. Percello

(57) ABSTRACT

A method of controlling formation of junctions in a lateral bipolar junction transistor comprises: providing a starting substrate comprising a bulk silicon material as a handle substrate, a buried oxide layer on the handle substrate, and an intrinsic base semiconductor layer of germanium on the buried oxide layer; forming an extrinsic base layer on the intrinsic base semiconductor layer; etching at least a portion of the base layer; disposing a sidewall spacer on a side of the base layer; disposing a faceted germanium layer adjacent the sidewall spacer; recessing the faceted germanium layer and the intrinsic base semiconductor layer below the sidewall spacer; using a hot angle ion implantation technique to implant ions into a side of the intrinsic base semiconductor layer to form a junction edge/profile; annealing the implanted ions; and epitaxially growing a Si or SiGe layer on the germanium layer and the junction edge/profile.

13 Claims, 8 Drawing Sheets

(51) Int. Cl.
  *H01L 29/10* (2006.01)
  *H01L 29/06* (2006.01)
  *H01L 21/30* (2006.01)
  *H01L 21/02* (2006.01)
  *H01L 21/26* (2006.01)
  *H01L 21/32* (2006.01)
  *H01L 29/04* (2006.01)
  *H01L 29/08* (2006.01)
  *H01L 29/16* (2006.01)
  *H01L 29/66* (2006.01)
  *H01L 29/737* (2006.01)
  *H01L 21/265* (2006.01)
  *H01L 21/308* (2006.01)
  *H01L 21/306* (2006.01)
  *H01L 21/324* (2006.01)
  *H01L 21/762* (2006.01)
  *H01L 29/165* (2006.01)
  *H01L 29/167* (2006.01)

(52) U.S. Cl.
  CPC .. *H01L 21/26513* (2013.01); *H01L 21/26586* (2013.01); *H01L 21/308* (2013.01); *H01L 21/30604* (2013.01); *H01L 21/324* (2013.01); *H01L 21/76283* (2013.01); *H01L 29/04* (2013.01); *H01L 29/0649* (2013.01); *H01L 29/0688* (2013.01); *H01L 29/0817* (2013.01); *H01L 29/0821* (2013.01); *H01L 29/1004* (2013.01); *H01L 29/165* (2013.01); *H01L 29/167* (2013.01); *H01L 29/66242* (2013.01)

(58) Field of Classification Search
  CPC ......... H01L 21/30604; H01L 21/02532; H01L 21/26513; H01L 21/324; H01L 29/04; H01L 29/0817; H01L 29/0821; H01L 29/167; H01L 29/66242; H01L 29/0688; H01L 21/0262; H01L 29/16
  USPC .......................................................... 257/51
  See application file for complete search history.

(56) References Cited

U.S. PATENT DOCUMENTS

| | | | |
|---|---|---|---|
| 6,509,221 B1 * | 1/2003 | Doris | H01L 21/26586 257/E21.345 |
| 9,318,585 B1 * | 4/2016 | Cai | H01L 29/66242 |
| 9,437,718 B1 | 9/2016 | Cai et al. | |
| 9,673,307 B1 * | 6/2017 | Chan | H01L 29/735 |
| 9,761,608 B1 * | 9/2017 | Balakrishnan | H01L 27/1203 |
| 2006/0105511 A1 * | 5/2006 | Yang | H01L 29/6659 438/197 |
| 2012/0261754 A1 * | 10/2012 | Cheng | H01L 29/66772 257/347 |
| 2015/0236093 A1 * | 8/2015 | Chan | H01L 29/66272 257/565 |
| 2016/0087068 A1 * | 3/2016 | Cai | H01L 29/6625 257/526 |

* cited by examiner

METHOD OF JUNCTION CONTROL FOR LATERAL BIPOLAR JUNCTION TRANSISTOR

CROSS REFERENCE TO A RELATED APPLICATION

This patent application is a divisional patent application of copending U.S. patent application Ser. No. 15/270,144, filed Sep. 20, 2016, the disclosure of which is incorporated by reference herein in its entirety.

BACKGROUND

The exemplary embodiments described herein relate generally to semiconductor devices and methods for the fabrication thereof and, more specifically, to structures and methods for controlling the formation of junction defects in lateral bipolar junction transistors.

A bipolar junction transistor (BJT) is a semiconductor device comprising three sections of semiconductor material arranged to alternate between P-type and N-type, the sections of semiconductor material forming a base, an emitter, and a collector, thus resulting in a three-region device having an emitter region, a base region, and a collector region having two P-N junctions with one P-N junction being between the emitter and the base and the other P-N junction being between the collector and the base. Each bipolar junction transistor is thus classified as either PNP or NPN according to the arrangement of the P-type material and N-type material. An NPN BJT has an N-type emitter, a P-type base, and an N-type collector, and a PNP BJT has a P-type emitter, an N-type base, and a P-type collector. The function of a BJT is to amplify current, i.e. the collector current (output signal) is larger than the base current (input signal). In a lateral BJT, the base is located between emitter and the collector channels, with the emitter/base junction and the collector/base junction being formed between laterally arranged components.

Germanium may be used in the fabrication of lateral BJTs and can offer high cut off frequencies in both NPN- and PNP-types of BJTs. However, controlling the doping of the emitter/base junction and the collector/base junction using regular ion-implant techniques may be difficult due to insufficient depth control of the implantation, which may result in the obtained lateral and vertical profiles being non-uniform.

Methods of growing faceted epitaxial layers to define the emitter and the collector followed by a recess and re-growth of the epitaxial layers to form channels have been used. In using epitaxial methods on lateral BJTs, however, any non-ideal interface between the epitaxial layers and the germanium surface may be problematic. Such problems may be more prevalent in germanium channel devices as opposed to silicon channel devices since the germanium generally does not tolerate the temperatures of an epitaxial pre-bake process due to the germanium having a lower melting point than silicon. Therefore, in germanium channel devices subjected to the epitaxial pre-bake process, interfaces between the emitter channel and the base as well as interfaces between the collector channel and the base may be less than optimal.

BRIEF SUMMARY

In one exemplary aspect, a method comprises: forming trench isolations in an intrinsic base semiconductor layer of a substrate, the substrate comprising the intrinsic semiconductor layer located on a buried oxide layer, the buried oxide layer being located on a handle substrate; forming an extrinsic base layer on the intrinsic base semiconductor layer and the formed trench isolations; applying a mask to a portion of the extrinsic base layer; etching an exposed portion of the extrinsic base layer not masked; disposing a sidewall spacer on an exposed side of the extrinsic base layer and the mask; disposing a germanium layer adjacent the sidewall spacer; recessing the germanium layer and the intrinsic base semiconductor layer below the sidewall spacer to expose a vertical side of the intrinsic base semiconductor layer; implanting ions into an exposed vertical side of the intrinsic base semiconductor layer under the sidewall spacers to form a junction edge/profile; annealing the implanted ions; and epitaxially growing a doped Si or SiGe layer on the exposed vertical side of the recessed intrinsic base semiconductor layer, the faceted surface of the germanium layer adjacent the sidewall spacer, and the exposed vertical side of the junction edge/profile to form a channel.

In another exemplary aspect, a method of controlling formation of emitter/base and collector/base junctions in a lateral bipolar junction transistor comprises: providing a starting substrate comprising a bulk silicon material as a handle substrate, a buried oxide layer on the handle substrate, and an intrinsic base semiconductor layer of germanium on the buried oxide layer; forming an extrinsic base layer on the intrinsic base semiconductor layer; etching at least a portion of the base layer; disposing a sidewall spacer on a side of the base layer; disposing a faceted germanium layer adjacent the sidewall spacer; recessing the faceted germanium layer and the intrinsic base semiconductor layer below the sidewall spacer to expose a side of the intrinsic base semiconductor layer; using a hot angle ion implantation technique to implant ions into a side of the intrinsic base semiconductor layer to form a junction edge/profile; annealing the implanted ions; and epitaxially growing a Si or SiGe layer on the recessed faceted germanium layer and the junction edge/profile to form a channel.

In another exemplary aspect, an apparatus comprises: a starting substrate comprising a bulk silicon material as a handle substrate, a buried oxide layer on the handle substrate, and an intrinsic base semiconductor layer of germanium on the buried oxide layer; an extrinsic base layer of doped polycrystalline silicon or polycrystalline SiGe disposed on the intrinsic base semiconductor layer; a layer of germanium positioned on the buried oxide layer, wherein an angled surface of a facet of the layer of germanium extends away from a vertical surface of the intrinsic base semiconductor layer; and an epitaxial layer of doped polycrystalline silicon or polycrystalline SiGe disposed on the faceted layer of germanium positioned on the buried oxide layer, on the buried oxide layer, and on the vertical surface of the intrinsic base semiconductor layer to form a channel. The vertical surface of the intrinsic base semiconductor layer comprises a heavily doped base junction in the material of the intrinsic base semiconductor layer.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Disclosed herein are exemplary methods for the fabrication of lateral bipolar junction transistors (BJTs) using a low energy hot ion-implant (I/I) process prior to epitaxial growth and faceting of layers of germanium to form collector and emitter channels adjacent to base layers of the BJTs. Such methods are employed in an effort to accurately control the positions of the junctions between the base layers and the collector and emitter channels. The hot I/I process (ion implantation into targets at elevated temperatures) hampers the formation of crystallographic defects at the junctions. Furthermore, the junction interfaces are located distal from the interfaces of the epitaxially grown channels. As used herein "epitaxially grown" indicates that a contact surface of a first element has a same crystal orientation as a growth surface of a second element on the first element.

Figure 1:
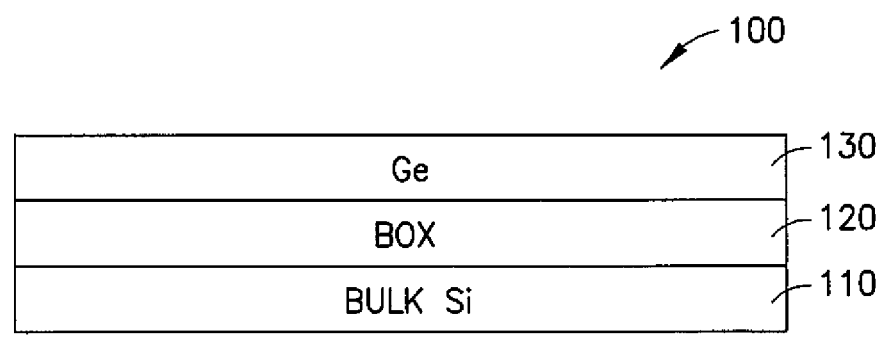
FIG. 1 is a schematic representation of one exemplary embodiment of a starting substrate on which a BJT may be formed.

Referring to FIG. 1, a starting substrate 100 on which lateral BJTs may be fabricated is provided. The substrate 100 may comprise a bulk silicon material 110 as a handle substrate and may include a buried oxide (BOX) layer 120 of silicon dioxide ($SiO_2$) thereon over which an intrinsic base semiconductor layer 130 is provided. The intrinsic base semiconductor layer 130 may comprise germanium. Other exemplary suitable materials for the support of the BJT include, but are not limited to, Si and SiGe (silicon germanium). However, the use of germanium may be preferable to Si or SiGe in order to obtain a BJT having more desirable performance characteristics from a lower operation voltage desired to achieve the same current level or higher current output at the same applied voltage as compared to Si and SiGe. The application of any of the foregoing exemplary materials would denote the starting substrate 100 as a germanium-on-insulator (GeOI) substrate, a silicon-on-insulator (SOI) substrate, or a SiGe-on-insulator (SGOI) substrate. Intrinsic base semiconductor layer 130 may have a doping of P-type for a lateral NPN BJT, or a doping of N-type for a lateral PNP BJT. Intrinsic base semiconductor layer 130 can be doped in situ during epitaxial growth or doped by ion implantation after epitaxial growth. Suitable N-type dopants include arsenic, phosphorus, and antimony. Suitable P-type dopants include boron, aluminum, gallium, and indium.

Figure 2:
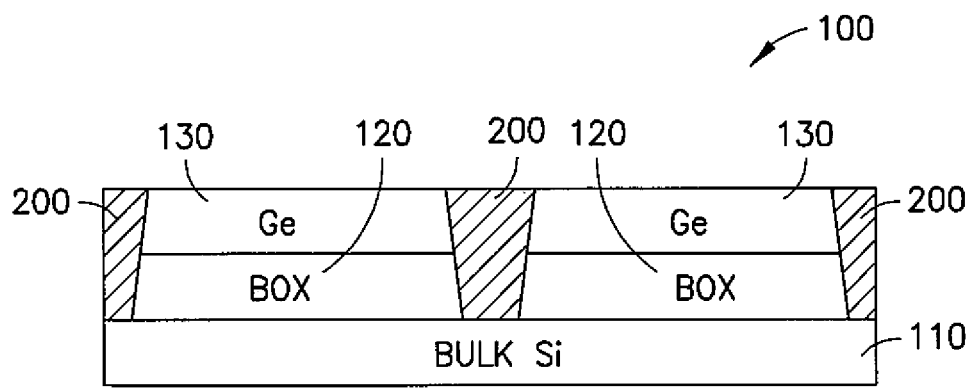
FIG. 2 is a schematic representation of the starting substrate of FIG. 1 in which trench isolations are formed in an intrinsic base semiconductor layer of the starting substrate.

Referring to FIG. 2, a trench isolation (e.g., shallow trench isolation) process may be used to form one or more trenches 200 in the intrinsic base semiconductor layer 130 and the BOX layer 120 to isolate structures subsequently formed on the starting substrate 100. The trenches 200 may be formed by an etch process. Exemplary etch processes include, but are not limited to, wet etch techniques (e.g., etching using polyphosphoric acids, hydrofluoric acid (HF), potassium hydroxide, or the like) or plasma or gas etch techniques. The trenches 200 may be filled with any suitable dielectric material such as $SiO_2$ or the like.

Figure 3:
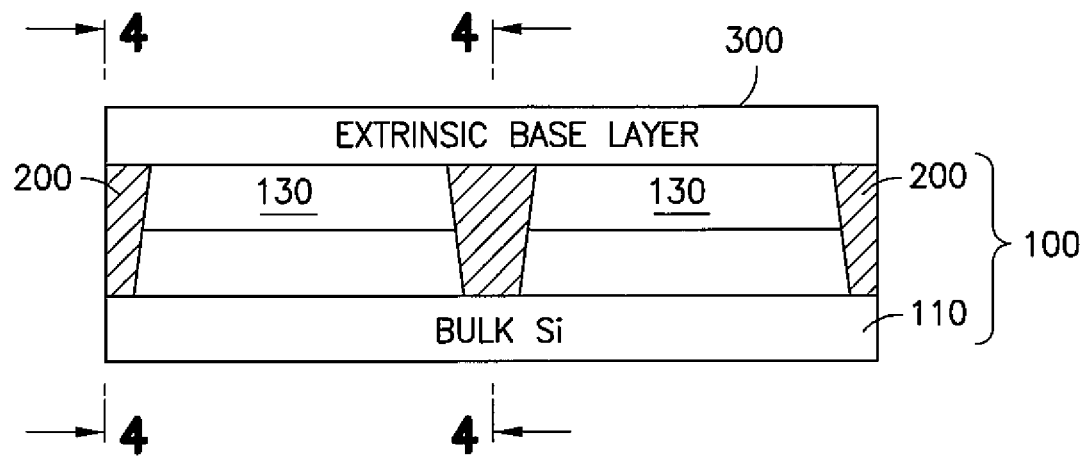
FIG. 3 is a schematic representation of an extrinsic base layer disposed on the starting substrate and trench isolations of FIG. 2.

Referring to FIG. 3, an extrinsic base layer 300 is disposed on the intrinsic base semiconductor layer 130 and the trenches 200 of the starting substrate 100. The extrinsic base layer 300 may be disposed on the intrinsic base semiconductor layer 130 using a chemical vapor deposition (CVD) technique or by epitaxial growth. The extrinsic base layer 300 may be polycrystalline silicon or polycrystalline SiGe and may be doped to have the same polarity as the intrinsic base layer 130. Suitable N-type dopants include, but are not limited to, arsenic, phosphorus, and antimony. Suitable P-type dopants include, but are not limited to, boron, aluminum, gallium, and indium.

Figure 4:
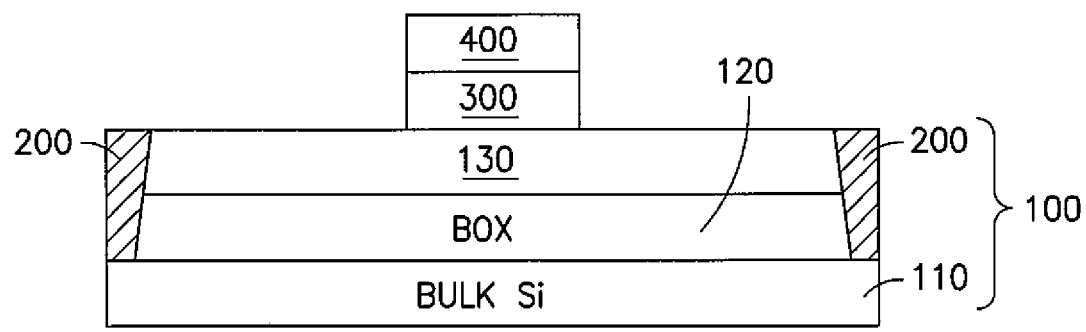
FIG. 4 is a schematic representation of a portion of the extrinsic base layer between two trench isolations, the extrinsic base layer being masked and etched.

Referring to FIG. 4, a portion of the extrinsic base layer 300 may be masked using a hardmask 400. The hardmask 400 may comprise any suitable hardmask material, such as $SiO_2$, a silicon nitride, or the like and may be deposited on the extrinsic base layer 300 using CVD, physical vapor deposition (PVD), or a similar technique. Exposed portions of the material of the extrinsic base layer 300 (portions not masked by the hardmask 400) may be removed using any suitable etching process. One exemplary suitable etching process comprises reactive ion etching (RIE), although any other suitable dry etch process may be used.

Figure 5:
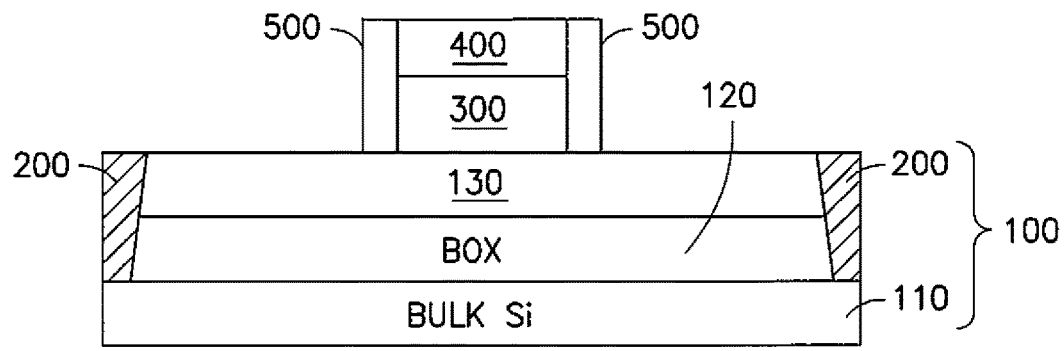
FIG. 5 is a schematic representation of the masked and etched extrinsic base layer of FIG. 4 with sidewall spacers.

Referring to FIG. 5, sidewall spacers 500 are disposed on the sides of the extrinsic base layer 300 and the hardmask 400. The sidewall spacers 500 are formed by the deposition of dielectric material, such as $SiO_2$, silicon nitride, low-permittivity (low-K) dielectrics such as $SiO_xN_y$, or boron nitride via CVD or low pressure CVD (LPCVD).

Figure 6:
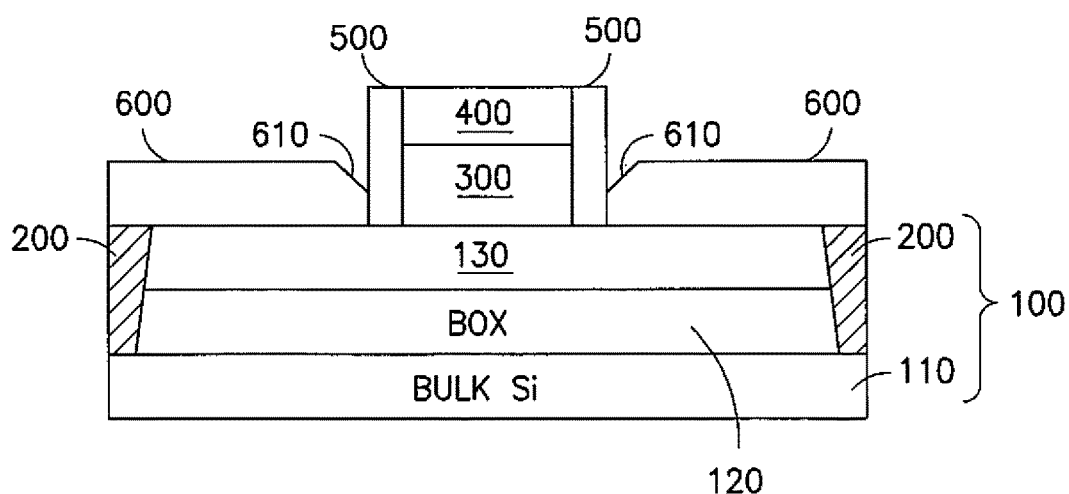
FIG. 6 is a schematic representation of faceted layers on the intrinsic base semiconductor layer adjacent the sidewall spacers.

Referring to FIG. 6, layers 600 are epitaxially grown adjacent the sidewall spacers 500 using CVD. Facets 610 are formed on surfaces of the layers adjacent the sidewall spacers 500 by tuning epitaxial growth conditions including, but not limited to, pressure, temperature, and flow rates of materials forming the layers 600 deposited by the CVD. In doing so, desired {111} crystallographic planes of the materials forming the layers 600 are epitaxially grown. Materials from which layers 600 may be epitaxially grown include, but are not limited to, germanium.

Figure 7:
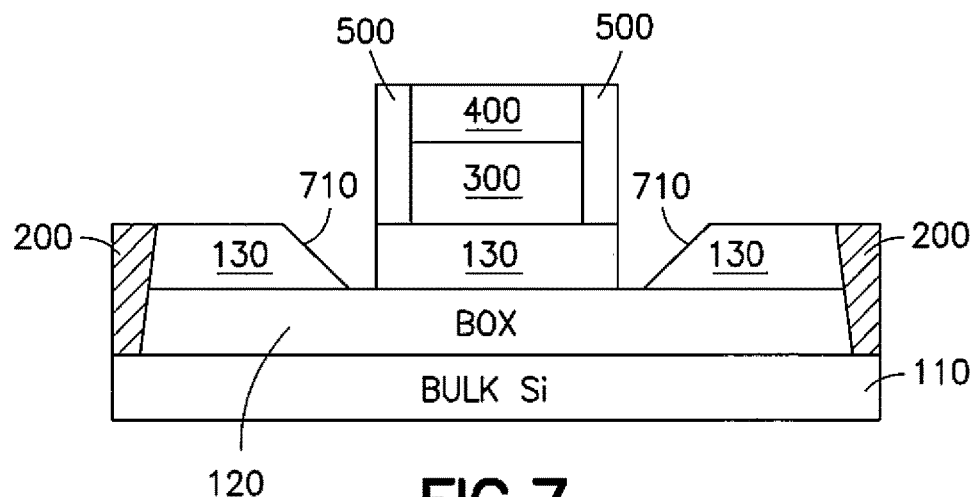
FIG. 7 is a schematic representation of the faceted layers of FIG. 6 recessed.

Referring to FIG. 7, the layers 600 and the intrinsic base semiconductor layer 130 are recessed by etching. The etching completely removes the epitaxially grown layers 600 and portions of the intrinsic base semiconductor layer 130 such that base portions of the sidewall spacers 500 are completely exposed with a portion of the intrinsic base semiconductor layer 130 remaining under the sidewall spacers 500 and under the extrinsic base layer 300. In doing so, the epitaxially grown layers 600 and portions of the intrinsic base semiconductor layer 130 are removed below an upper surface of the portion of the intrinsic base semiconductor layer 130 under the hardmask 400, the extrinsic base layer 300, and the sidewall spacers 500. The etching is substantially uniform over the layers 600 and the intrinsic base semiconductor layer 130 such that facets 710 are formed in the recessed portions of the intrinsic base semiconductor layer 130 with the facets 710 terminating on the $SiO_2$ of the BOX layer 120. The etching also exposes portions of the BOX layer 120 between the facets 710 and the intrinsic base semiconductor layer 130 under the sidewall spacers 500. One exemplary suitable etching process is a partial RIE process, although any other suitable dry etch process may be used. In any etching process used, the process is a partial etch such that the layers 600 and the intrinsic base semiconductor layer 130 are recessed, the partial etch being terminated before the intrinsic base semiconductor layer 130 is completely removed.

Figure 8:
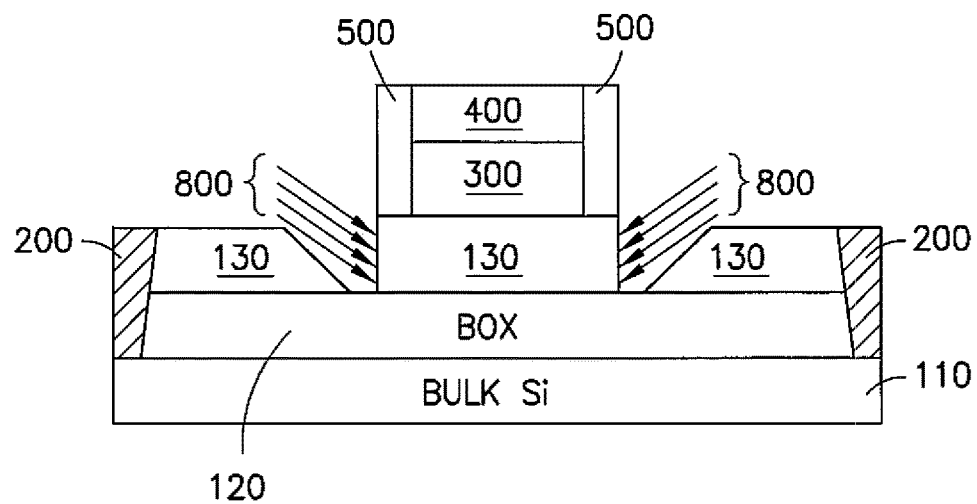
FIG. 8 is a schematic representation of exposed portions of the intrinsic base semiconductor layer subjected to an ion implantation.

Referring to FIG. 8, an angled hot ion implantation (I/I) of appropriate ions 800 into the exposed vertical sides of the intrinsic base semiconductor layer 130 under the sidewall spacers 500 is carried out to form a junction edge/profile. Implantation of the ions 800 is to a depth of 2 nanometers (nm) to 20 nm, which may assist in the reduction of band-to-band tunneling in the BJT. In some embodiments, the implantation of the ions 800 is to a depth of 5 nm to 10 nm. Furthermore, the I/I may add some precision to control the junction and position the junction relative to the outer edges of the sidewall spacers 500. Exemplary ions for the I/I into the exposed vertical sides of the intrinsic base semiconductor layer 130 include, but are not limited to, hot arsenic or phosphorous for a lateral NPN BJT, and boron difluoride ($BF_2$) for a lateral PNP BJT.

Figure 9:
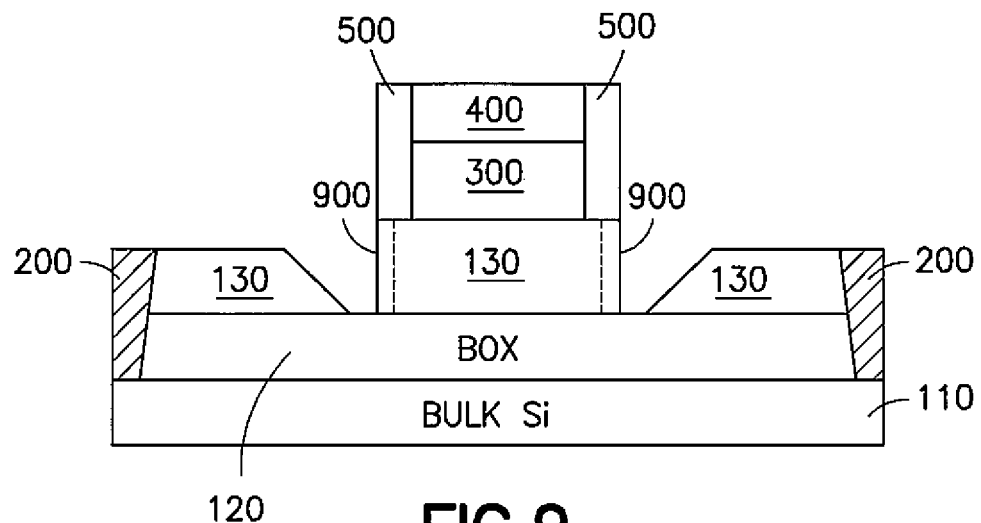
FIG. 9 is a schematic representation of doped emitter and collector junctions in the material of the intrinsic base semiconductor layer under the sidewall spacers.

Referring to FIG. 9, an anneal process is carried out after the I/I to form heavily doped emitter/base and collector/base junctions 900 in the material of the intrinsic base semiconductor layer 130 under the sidewall spacers 500. The anneal process is a low temperature junction anneal, for example, carried out at about 500 degrees C. for about 30 seconds.

Figure 10:
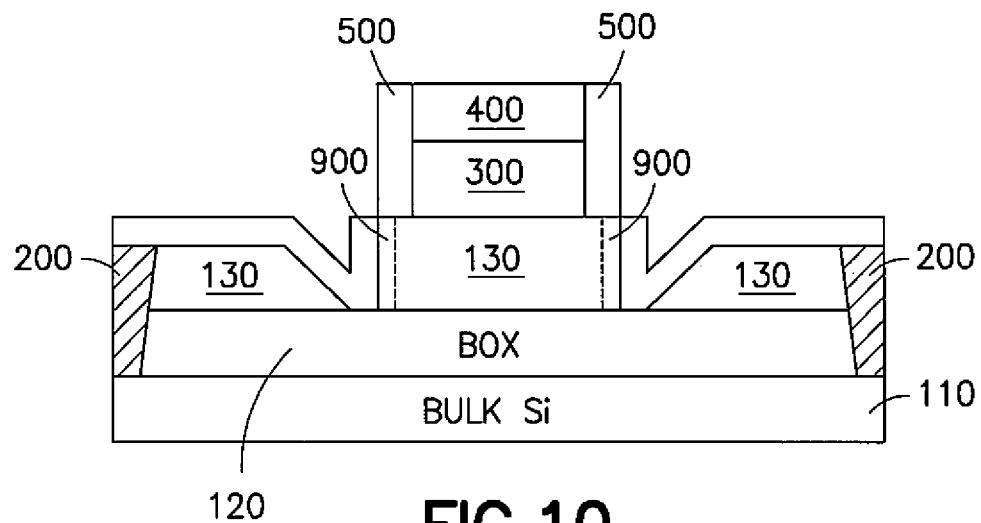
FIG. 10 is a schematic representation of a doped epitaxial layer on exposed portions of the recessed intrinsic base semiconductor layer and facets and exposed vertical sides of the emitter and collector junctions.

Referring to FIG. 10, a doped Si or SiGe layer is epitaxially grown in situ on the exposed portions of the recessed intrinsic base semiconductor layer 130 and the facets 710 and the exposed vertical sides of the emitter/collector junctions 900 to form emitter channels 1000 and collector channels 1000. The doped Si or SiGe layer is doped polycrystalline silicon or doped polycrystalline SiGe. For a lateral NPN BJT the layer may be doped in situ with phosphorous, arsenic, or antimony, and for a lateral PNP BJT the layer may be doped in situ with boron, aluminum, gallium, or indium.

Figure 11:
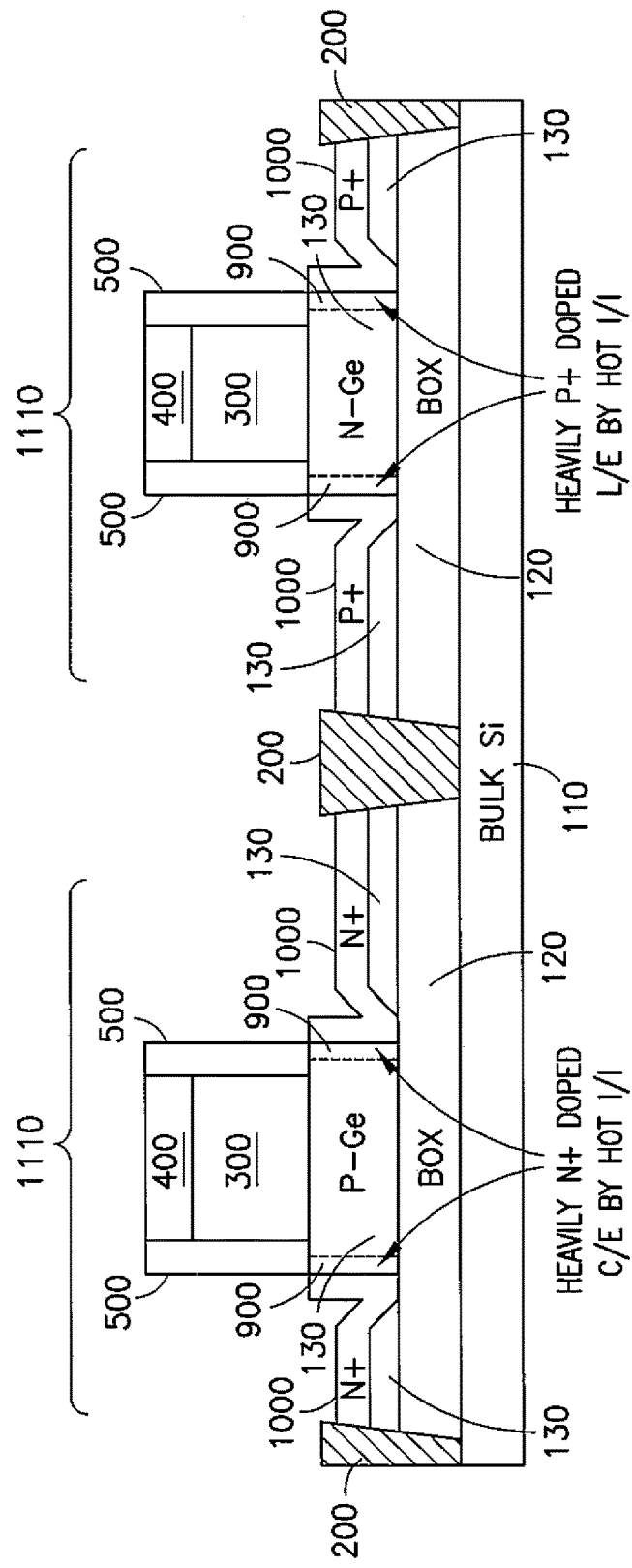
FIG. 11 is a schematic representation of an NPN lateral BJT structure and a PNP lateral BJT structure on a substrate.

Referring to FIG. 11, an NPN BJT 1100 and a complementary PNP BJT 1110 are shown disposed on a single handle substrate of bulk silicon material 110. The NPN BJT 1100 and the PNP BJT 1110 are separated on the bulk silicon material 110 by the trench 200. As can be seen, emitter/base junctions 900 and collector/base junctions 900 on the NPN BJT 1100 are heavily N+ doped by the I/I, and the emitter/collector junctions 900 on the PNP BJT 1110 are heavily P+ doped by the I/I. Any number of NPN BJTs 1100 and PNP BJTs 1110 may be alternatingly arranged on the handle substrate.

Figure 12:
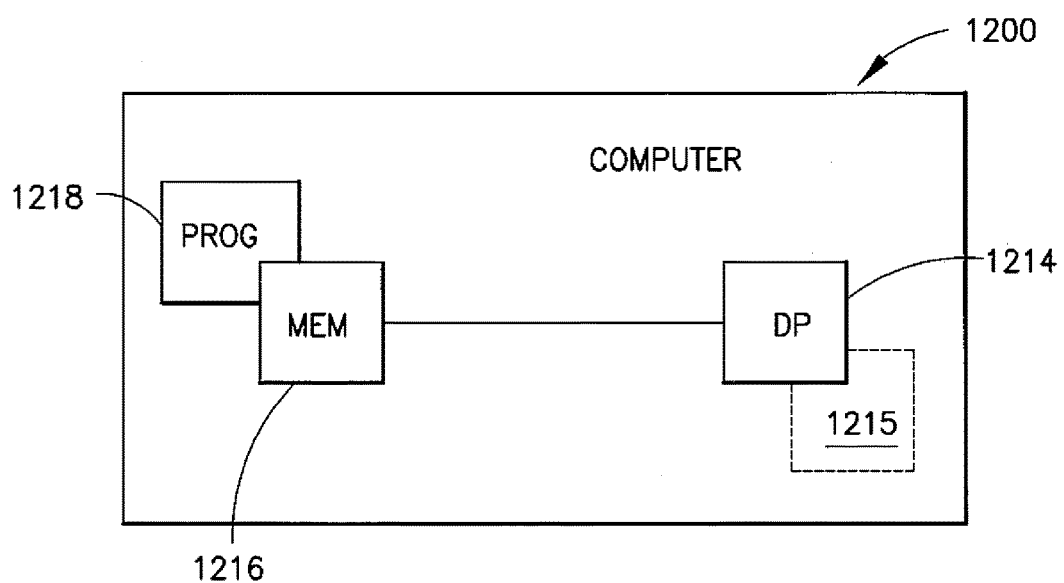
FIG. 12 is a block diagram of various electronic devices and apparatuses that may be suitable for use in forming the exemplary BJT structures described herein.

Referring to FIG. 12, a simplified block diagram of various electronic devices and apparatuses that are suitable for use in practicing the exemplary embodiments described herein is shown. For example, a computer 1200 may be used to control one or more of the fabrication processes (e.g., deposition of hardmask layer 400, formation of trenches 200, deposition of sidewall spacers 500, deposition of the intrinsic base semiconductor layer 130, deposition of the extrinsic base layer 300, and the like) as described above. The computer 1200 includes a data processor (DP) 1214 and a computer-readable memory medium embodied as a memory (MEM) 1216 that stores a program of computer instructions (PROG) 1218.

The PROG 1218 includes program instructions that, when executed by the associated DP 1214, enable the various electronic devices and apparatus to operate in accordance with exemplary embodiments. That is, various exemplary embodiments may be implemented at least in part by computer software executable by the DP 1214, or by hardware, or by a combination of software and hardware (and firmware).

The computer 1200 may also include dedicated processors, for example processor 1215 used for carrying out the various deposition techniques for fabricating the BJTs.

The computer readable MEM 1216 may be of any type suitable to the local technical environment and may be implemented using any suitable data storage technology, such as semiconductor based memory devices, flash memory, magnetic memory devices and systems, optical memory devices and systems, fixed memory, and removable memory. The DP 1214 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Figure 13:
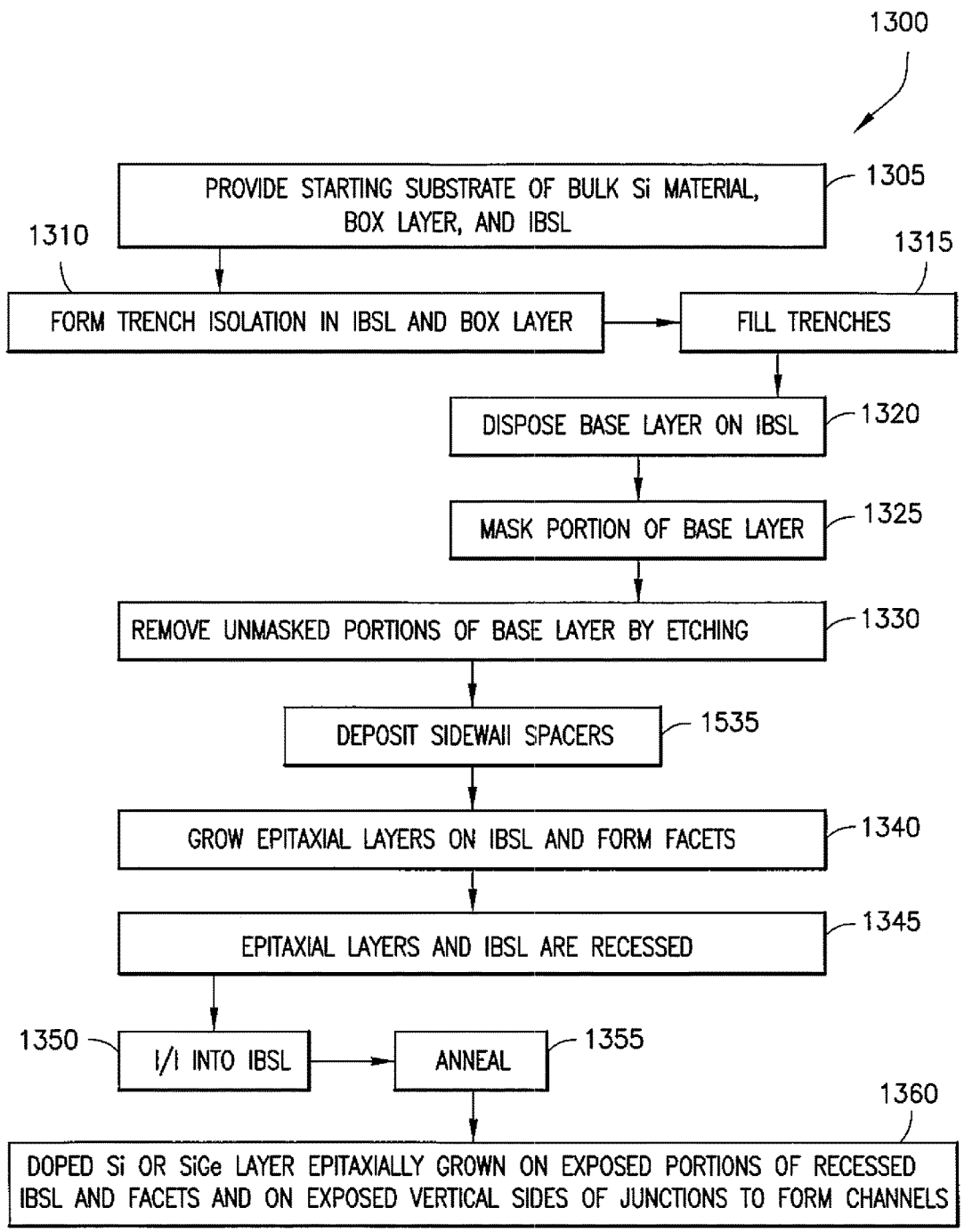
FIG. 13 is a logic flow diagram that illustrates the operation of an exemplary method, and a result of execution of computer program instructions embodied on a computer readable memory, in accordance with an exemplary embodiment of the methods for forming the exemplary BJT structures described herein.

FIG. 13 is a logic flow diagram that illustrates the operation of a method 1300 (and a result of an execution of computer program instructions (such as PROG 1218)), in accordance with the exemplary embodiments. In accordance with these exemplary embodiments, a starting substrate of bulk silicon material, a BOX layer, and an intrinsic base semiconductor layer is provided as shown in block 1305. Trenches are formed in the intrinsic base semiconductor layer and BOX layer, as shown in block 1310. As shown in block 1315, the trenches are filled. As shown in block 1320, an extrinsic base layer is disposed on the intrinsic base semiconductor layer and the filled trenches. Portions of the extrinsic base layer are masked, as shown in block 1325, and unmasked portions of the extrinsic base layer are removed by etching, as shown in block 1330. Sidewall spacers are deposited on vertical surfaces of the remaining hardmask and the extrinsic base layer, as shown in block 1335. As shown in block 1340, layers are epitaxially grown adjacent the sidewall spacers, and facets are formed on surfaces of the layers adjacent the sidewall spacers. Referring now to block 1345, the layers and the intrinsic base semiconductor layer are recessed by etching. As shown in block 1350, ions are implanted into exposed vertical surfaces of the intrinsic base semiconductor layer. As shown in block 1355, an anneal is carried out to form emitter and collector junctions. As shown in block 1360, a doped Si or SiGe layer is epitaxially grown in situ on the exposed portions of the recessed intrinsic base semiconductor layer and the facets and the exposed vertical sides of the emitter and collector junctions to form emitter channels and collector channels.

The various blocks of method 1300 shown in FIG. 13 may be viewed as method steps, and/or as operations that result from operation of computer program code, and/or as a plurality of coupled logic circuit elements constructed to carry out the associated function(s).

Referring now to all the Figures, in one exemplary embodiment, a method comprises: forming trench isolations in an intrinsic base semiconductor layer of a substrate, the substrate comprising the intrinsic base semiconductor layer located on a buried oxide layer, the buried oxide layer being located on a handle substrate; forming an extrinsic base layer on the intrinsic base semiconductor layer and the formed trench isolations; applying a mask to a portion of the extrinsic base layer; etching an exposed portion of the extrinsic base layer not masked; disposing a sidewall spacer on an exposed side of the extrinsic base layer and the mask; disposing a germanium layer adjacent the sidewall spacer; recessing the germanium layer and the intrinsic base semiconductor layer below the sidewall spacer to expose a vertical side of the intrinsic base semiconductor layer; implanting ions into an exposed vertical side of the intrinsic base semiconductor layer under the sidewall spacers to form a junction edge/profile; annealing the implanted ions; and epitaxially growing a doped Si or SiGe layer on the exposed vertical side of the recessed intrinsic base semiconductor layer, the faceted surface of the germanium layer adjacent the sidewall spacer, and the exposed vertical side of the junction edge/profile to form a channel.

In the method, disposing a germanium layer adjacent the sidewall spacer may comprise epitaxially growing a germanium layer. Epitaxially growing a germanium layer adjacent the sidewall spacer may comprise tuning at least one of pressure, temperature, and flow rate of material to provide a faceted surface facing the sidewall spacer. Recessing the germanium layer and the intrinsic base semiconductor layer below the sidewall spacer to expose a vertical side of the intrinsic base semiconductor layer may comprise etching by a partial reactive ion etching process to remove the germanium layer. Implanting ions into an exposed vertical side of the intrinsic base semiconductor layer under the sidewall spacers to form a junction edge/profile may comprise using an angled hot ion implantation technique. Using an angled hot implantation technique may comprise implanting ions to a depth of 2 nanometers to 20 nanometers. Annealing the implanted ions may form heavily doped emitter/base and collector/base junctions in the material of the intrinsic base semiconductor layer under the sidewall spacers. Annealing the implanted ions may comprise annealing at about 500 degrees C. for about 30 seconds. Epitaxially growing a doped Si or SiGe layer on the exposed vertical side of the recessed intrinsic base semiconductor layer, the faceted surface of the germanium layer adjacent the sidewall spacer, and the exposed vertical side of the junction edge/profile to form a channel may comprise doping in situ with phosphorous, arsenic, or antimony for a lateral NPN BJT or doping in situ with boron, aluminum, gallium, or indium for a lateral PNP BJT.

In another exemplary embodiment, a method of controlling formation of emitter/base and collector/base junctions in a lateral bipolar junction transistor comprises: providing a starting substrate comprising a bulk silicon material as a handle substrate, a buried oxide layer on the handle substrate, and an intrinsic base semiconductor layer of germanium on the buried oxide layer; forming an extrinsic base layer on the intrinsic base semiconductor layer; etching at least a portion of the base layer; disposing a sidewall spacer on a side of the base layer; disposing a faceted germanium layer adjacent the sidewall spacer; recessing the faceted germanium layer and the intrinsic base semiconductor layer below the sidewall spacer to expose a side of the intrinsic base semiconductor layer; using a hot angle ion implantation technique to implant ions into a side of the intrinsic base semiconductor layer to form a junction edge/profile; annealing the implanted ions; and epitaxially growing a Si or SiGe layer on the recessed faceted germanium layer and the junction edge/profile to form a channel.

The method may further comprise forming trench isolations through the intrinsic base semiconductor layer and through the buried oxide layer to the handle substrate. Forming an extrinsic base layer on the intrinsic base semiconductor layer may comprise depositing a material of the base layer by chemical vapor deposition technique or by epitaxial growth. Using a hot angle ion implantation technique to implant ions into a side of the intrinsic base semiconductor layer to form a junction edge/profile may comprise implanting ions to a depth of 2 nanometers to 20 nanometers. Annealing the implanted ions may comprise annealing at about 500 degrees C. for about 30 seconds to form heavily doped emitter/base and collector/base junctions in the material of the intrinsic base semiconductor layer under the sidewall spacers. Epitaxially growing a Si or SiGe layer on the recessed faceted germanium layer and the junction edge/profile to form a channel may comprise doping in situ with phosphorous, arsenic, or antimony for a lateral NPN BJT or doping in situ with boron, aluminum, gallium, or indium for a lateral PNP BJT.

In another exemplary embodiment, an apparatus comprises: a starting substrate comprising a bulk silicon material as a handle substrate, a buried oxide layer on the handle substrate, and an intrinsic base semiconductor layer of germanium on the buried oxide layer; an extrinsic base layer of doped polycrystalline silicon or polycrystalline SiGe disposed on the intrinsic base semiconductor layer; a layer of germanium positioned on the buried oxide layer, wherein an angled surface of a facet of the layer of germanium extends away from a vertical surface of the intrinsic base semiconductor layer; and an epitaxial layer of doped polycrystalline silicon or polycrystalline SiGe disposed on the faceted layer of germanium positioned on the buried oxide layer, on the buried oxide layer, and on the vertical surface of the intrinsic base semiconductor layer to form a channel. The vertical surface of the intrinsic base semiconductor layer comprises a heavily doped base junction in the material of the intrinsic base semiconductor layer.

In the apparatus, the base layer of doped polycrystalline silicon or polycrystalline SiGe may be doped with arsenic, phosphorus, or antimony as an N-type dopant or with boron, aluminum, gallium, or indium as a P-type dopant. The epitaxial layer of doped polycrystalline silicon or polycrystalline SiGe may be doped with phosphorous, arsenic, or antimony for a lateral NPN BJT or with boron, aluminum, gallium, or indium for a lateral PNP BJT. The vertical surface of the intrinsic base semiconductor layer may comprise implanted hot arsenic or phosphorous for a lateral NPN BJT, and boron difluoride ($BF_2$) for a lateral PNP BJT.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A method, comprising:
   forming trench isolations in an intrinsic base semiconductor layer of a substrate, the substrate comprising the intrinsic base semiconductor layer located on a buried oxide layer, the buried oxide layer being located on a handle substrate;
   forming an extrinsic base layer on the intrinsic base semiconductor layer and the formed trench isolations;
   applying a mask to a portion of the extrinsic base layer;
   etching an exposed portion of the extrinsic base layer not masked;
   disposing a sidewall spacer on an exposed side of the extrinsic base layer and the mask;
   disposing a germanium layer adjacent the sidewall spacer;
   recessing the germanium layer and the intrinsic base semiconductor layer below the sidewall spacer to expose a vertical side of the intrinsic base semiconductor layer;
   implanting ions into an exposed vertical side of the intrinsic base semiconductor layer under the sidewall spacers to form a junction edge/profile;
   annealing the implanted ions; and
   epitaxially growing a doped Si or SiGe layer on the exposed vertical side of the recessed intrinsic base semiconductor layer, a faceted surface of the germanium layer adjacent the sidewall spacer, and the exposed vertical side of the junction edge/profile to form a channel;
   wherein epitaxially growing the doped Si or SiGe layer on the exposed vertical side of the recessed intrinsic base semiconductor layer, the faceted surface of the germanium layer adjacent the sidewall spacer, and the exposed vertical side of the junction edge/profile to form the channel comprises doping in situ with phosphorous, arsenic, or antimony for a lateral NPN BJT or doping in situ with boron, aluminum, gallium, or indium for a lateral PNP BJT.

2. The method of claim 1, wherein disposing the germanium layer adjacent the sidewall spacer comprises epitaxially growing a germanium layer.

3. The method of claim 2, wherein epitaxially growing the germanium layer adjacent the sidewall spacer comprises tuning at least one of pressure, temperature, and flow rate of material to provide a faceted surface facing the sidewall spacer.

4. The method of claim 1, wherein recessing the germanium layer and the intrinsic base semiconductor layer below the sidewall spacer to expose the vertical side of the intrinsic base semiconductor layer comprises etching by a partial reactive ion etching process to remove the germanium layer.

5. The method of claim 1, wherein implanting ions into the exposed vertical side of the intrinsic base semiconductor layer under the sidewall spacers to form the junction edge/profile comprises using an angled hot ion implantation technique.

6. The method of claim 5, wherein using the angled hot implantation technique comprises implanting ions to a depth of 2 nanometers to 20 nanometers.

7. The method of claim 6, wherein annealing the implanted ions forms heavily doped emitter/base and collector/base junctions in a material of the intrinsic base semiconductor layer under the sidewall spacers.

8. The method of claim 7, wherein annealing the implanted ions comprises annealing at about 500 degrees C. for about 30 seconds.

9. A method of controlling formation of emitter/base and collector/base junctions in a lateral bipolar junction transistor, the method comprising:
   providing a starting substrate comprising a bulk silicon material as a handle substrate, a buried oxide layer on the handle substrate, and an intrinsic base semiconductor layer of germanium on the buried oxide layer;
   forming an extrinsic base layer on the intrinsic base semiconductor layer;
   etching at least a portion of the intrinsic base semiconductor layer;
   disposing a sidewall spacer on a side of the extrinsic base layer;
   disposing a faceted germanium layer adjacent the sidewall spacer;
   recessing the faceted germanium layer and the intrinsic base semiconductor layer below the sidewall spacer to expose a side of the intrinsic base semiconductor layer;
   using a hot angle ion implantation technique to implant ions into a side of the intrinsic base semiconductor layer to form a junction edge/profile;
   annealing the implanted ions; and
   epitaxially growing a Si or SiGe layer on the recessed faceted germanium layer and the junction edge/profile to form a channel;
   wherein epitaxially growing the Si or SiGe layer on the recessed faceted germanium layer and the junction edge/profile to form the channel comprises doping in situ with phosphorous, arsenic, or antimony for a lateral NPN BJT or doping in situ with boron, aluminum, gallium, or indium for a lateral PNP BJT.

10. The method of claim 9, further comprising forming trench isolations through the intrinsic base semiconductor layer and through the buried oxide layer to the handle substrate.

11. The method of claim 9, wherein forming the extrinsic base layer on the intrinsic base semiconductor layer comprises depositing a material of the extrinsic base layer by chemical vapor deposition technique or by epitaxial growth.

12. The method of claim 9, wherein using the hot angle ion implantation technique to implant ions into the side of the intrinsic base semiconductor layer to form the junction edge/profile comprises implanting ions to a depth of 2 nanometers to 20 nanometers.

13. The method of claim 9, wherein annealing the implanted ions comprises annealing at about 500 degrees C. for about 30 seconds to form heavily doped emitter/base and collector/base junctions in a material of the intrinsic base semiconductor layer under the sidewall spacer.

\* \* \* \* \*